United States Patent
Ebel et al.

(10) Patent No.: US 7,977,137 B1
(45) Date of Patent: Jul. 12, 2011

(54) LATCHING ZIP-MODE ACTUATED MONO WAFER MEMS SWITCH METHOD

(75) Inventors: John L. Ebel, Beavercreek, OH (US); Rebecca Cortez, Schenectady, NY (US); Kevin D. Leedy, Centerville, OH (US); Richard E. Strawser, Greenville, OH (US); Donald E. Strawser, legal representative, Greenville, OH (US)

(73) Assignee: The United States of America as represented by the Secretary of the Air Force, Washington, DC (US)

( * ) Notice: Subject to any disclaimer, the term of this patent is extended or adjusted under 35 U.S.C. 154(b) by 485 days.

(21) Appl. No.: 12/152,130

(22) Filed: May 8, 2008

Related U.S. Application Data

(63) Continuation-in-part of application No. 10/901,315, filed on Jul. 27, 2004, now Pat. No. 7,381,583.

(60) Provisional application No. 60/930,357, filed on May 11, 2007, provisional application No. 60/573,892, filed on May 24, 2004.

(51) Int. Cl.
*H01L 21/00* (2006.01)

(52) U.S. Cl. .......... 438/53; 257/415; 257/E21.309; 200/181

(58) Field of Classification Search ............ 438/53; 257/415, E21.309; 200/181
See application file for complete search history.

(56) References Cited

U.S. PATENT DOCUMENTS

| | | | |
|---|---|---|---|
| 6,100,477 A * | 8/2000 | Randall et al. ............. | 200/181 |
| 6,384,353 B1 * | 5/2002 | Huang et al. ............... | 200/181 |
| 6,621,022 B1 * | 9/2003 | Ma et al. .................... | 200/267 |
| 6,969,630 B2 * | 11/2005 | Ozgur ......................... | 438/53 |
| 7,145,213 B1 | 12/2006 | Ebel et al. | |
| 2002/0055260 A1 * | 5/2002 | Chow et al. ................ | 438/689 |
| 2007/0256917 A1 | 11/2007 | Oberhammer et al. | |
| 2007/0298532 A1 * | 12/2007 | Machauf ..................... | 438/48 |

OTHER PUBLICATIONS

J. Ebel et al., "MEMS RF Switch Integrated Process", U.S. Appl. No. 10/901,315, filed Jul. 27, 2004.
J. Ebel et al., "A Latching Capacitive RF MEMS Switch in a Thin Film Package", Proceedings, IEEE International Microwave Symposium, Jun. 2006.
G. Ionis et al., "A Zipper-Action Differential Micro-mechanical Tunable Capacitor", MEMS Conference Digest, Aug. 2001, pp. 29-32.
M. Shikida et al., "Micromachined S-Shaped Actuator", IEEE Sixth International Symposium on Micro Machine and Human Science, 1995, pp. 167-172.

(Continued)

*Primary Examiner* — Steven J Fulk
(74) *Attorney, Agent, or Firm* — AFMCLO/JAZ; Daniel J. Krieger

(57) ABSTRACT

A process for making a latching zip-mode actuated mono wafer MEMS switch especially suited to capacitance coupled signal switching of microwave radio frequency signals is disclosed. The single wafer fabrication process used for the switch employs sacrificial layers and liquid removal of these layers in order to also provide needed permanent physical protection for an ultra fragile switch moving arm member. Latched operation of the achieved MEMS switch without use of conventional holding electrodes or magnetic fields is also achieved. Fabrication of a single MEMS switch is disclosed however large or small arrays may be achieved. A liquid removal based fabrication process is disclosed.

18 Claims, 18 Drawing Sheets

Switch in "ON" (top), and "OFF" position (bottom)

OTHER PUBLICATIONS

E.K. Chan, "Effects of Capacitors, Resistors and Residual Charge on the Static and Dynamic Performance of Electrostatically-Actuated Devices", SPIE Symposium on Design, Test, and Microfabrication of MEMS and MOEMS, Mar.-Apr. 1999, pp. 120-130 vol. 3680.

C. Goldsmith et al., "Lifetime Characterization of Capacitive RF MEMS Switches", IEEE MTT-S Digest, 2001, pp. 227-230.

C. Cabuz et al., "Factors Enhancing the Reliability of Touch-Mode Electrostatic Actuators", Sensors and Actuators, 2000, pp. 245-250, vol. 79, Elsevier.

J. Oberhammer et al., Design and Fabrication Aspects of an S-Shaped Film Actuator Based DC to RF MEMS Switch, Journal of Microelectromechanical Systems, Jun. 2004, pp. 421-428, vol. 13, No. 3.

J. Oberhammer et al., "RF Characterization of Low-Voltage High-Isolation MEMS Series Switch Based on a S-Shaped Film Actuator", Proceedings SBMO/IEEE MTT-S IMOC, 2003, pp. 537-540.

J. Oberhammer et al., "Low-Voltage High-Isolation DC-to-RF MEMS Switch Based on an S-Shaped Film Actuator", IEEE Transactions on Electron Devices, Jan. 2004, pp. 149-155, vol. 51, No. 1.

\* cited by examiner

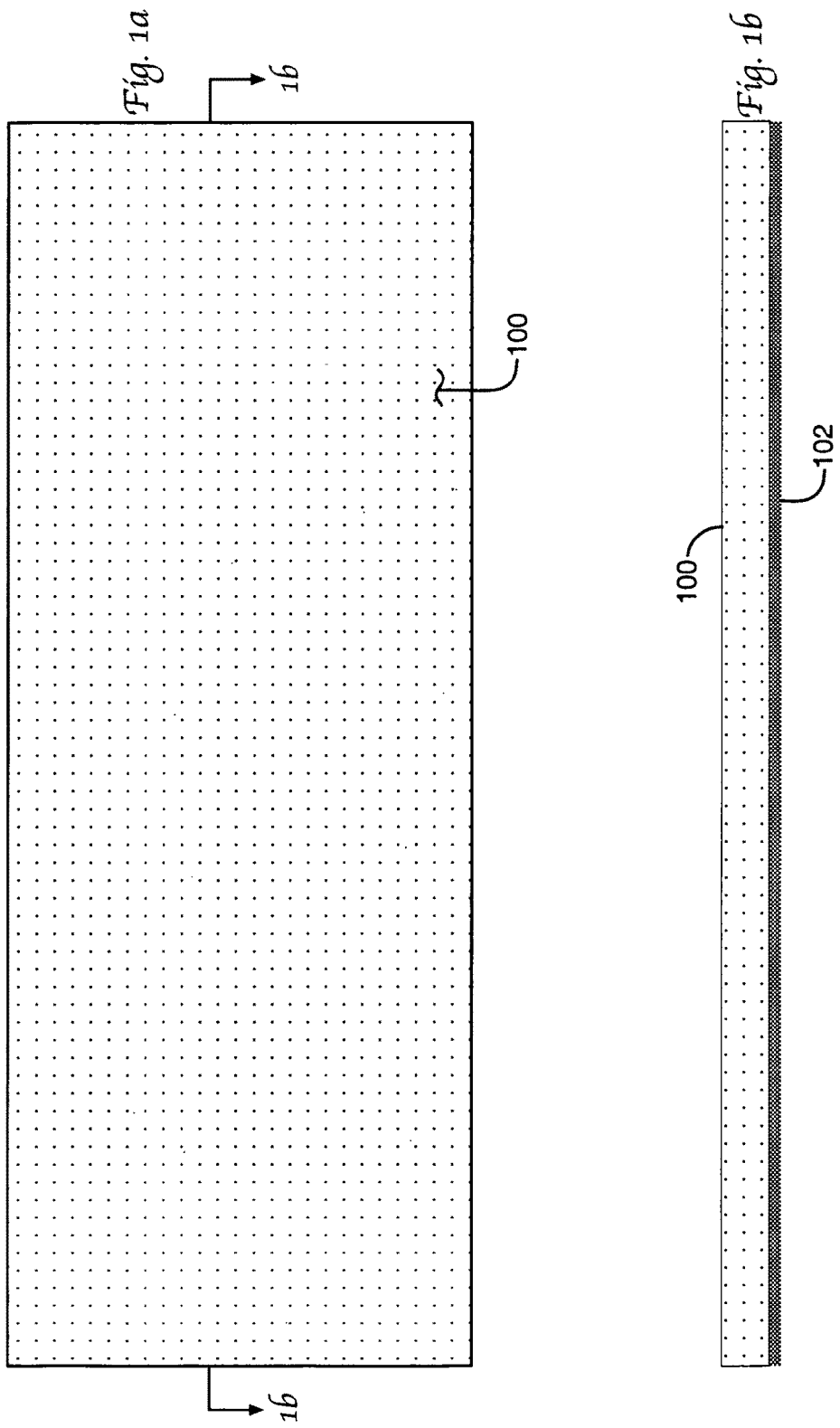
Fig. 1 Fused silica wafer with backside metal

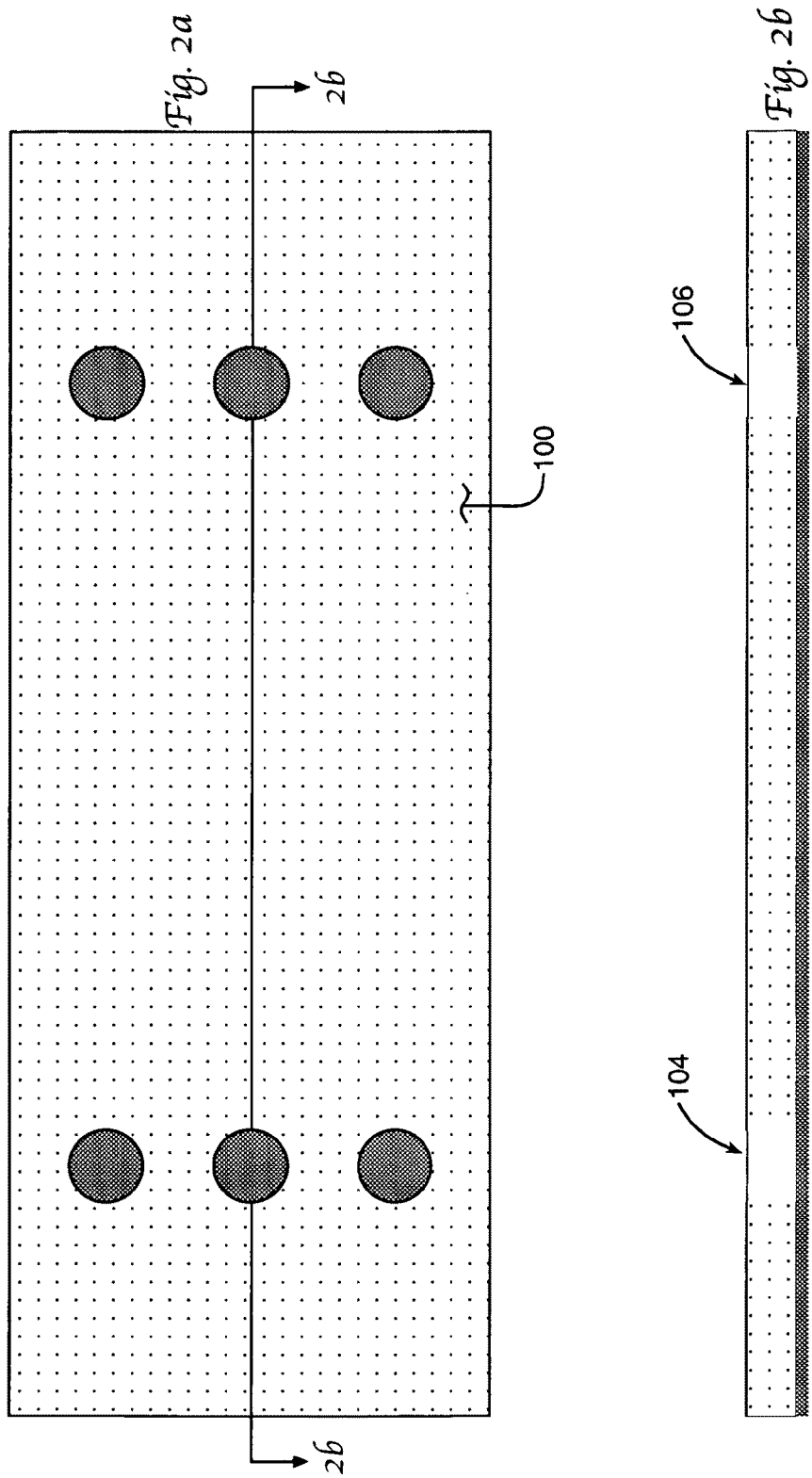
Fig. 2 Via etch, stopping on backside metal (mask 1)

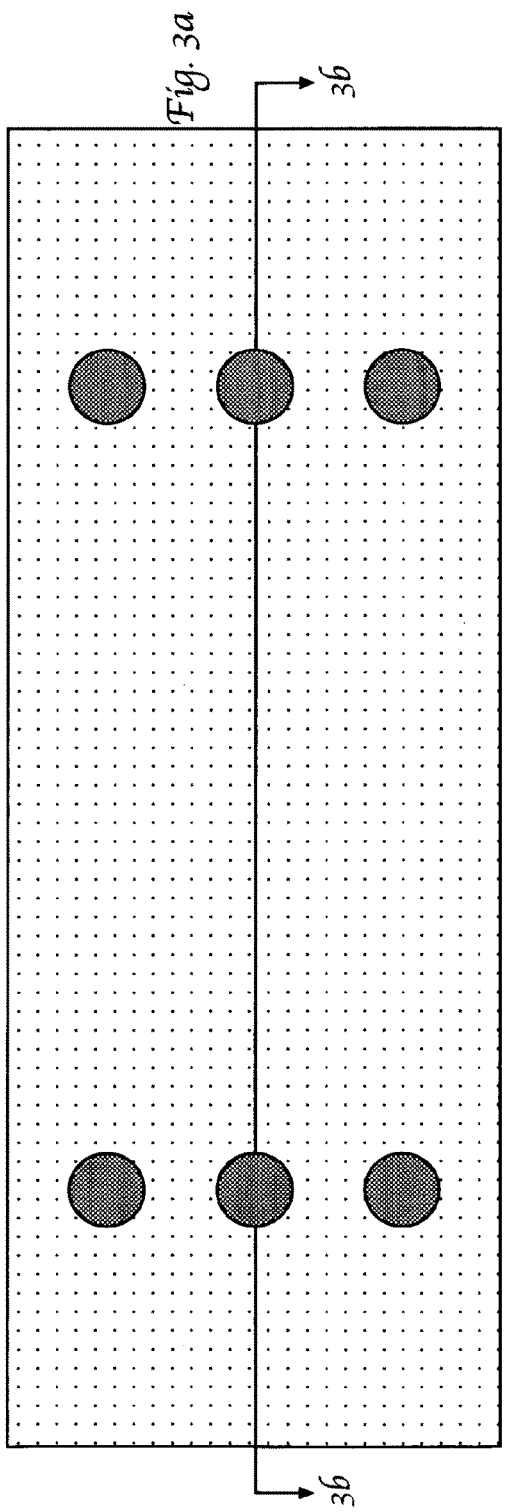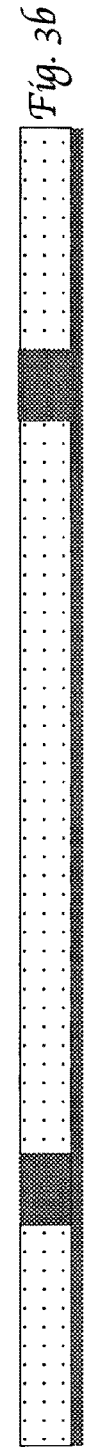
Fig. 3a
Fig. 3b
Fig. 3  Via plated through wafer

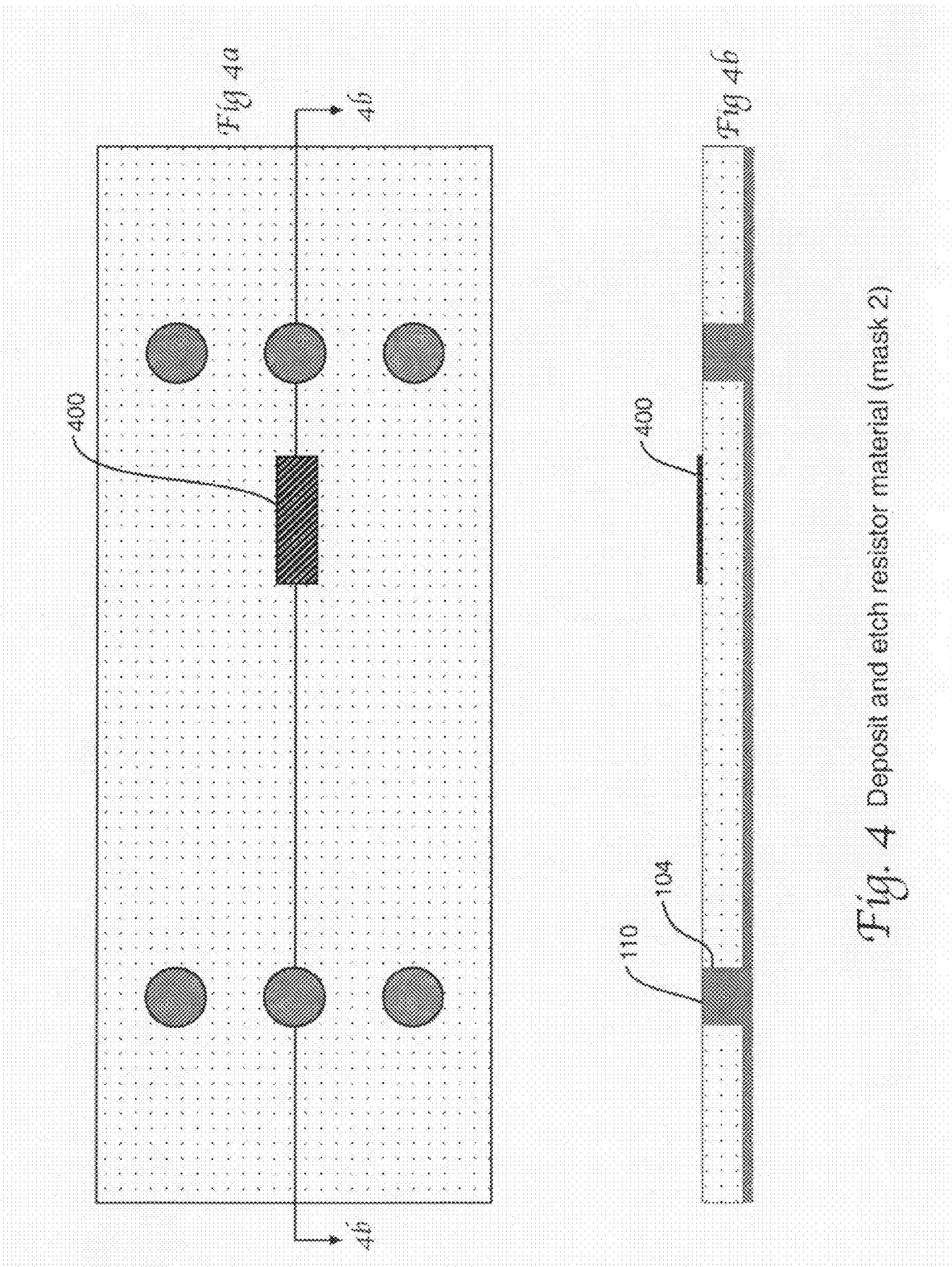
Fig. 4 Deposit and etch resistor material (mask 2)

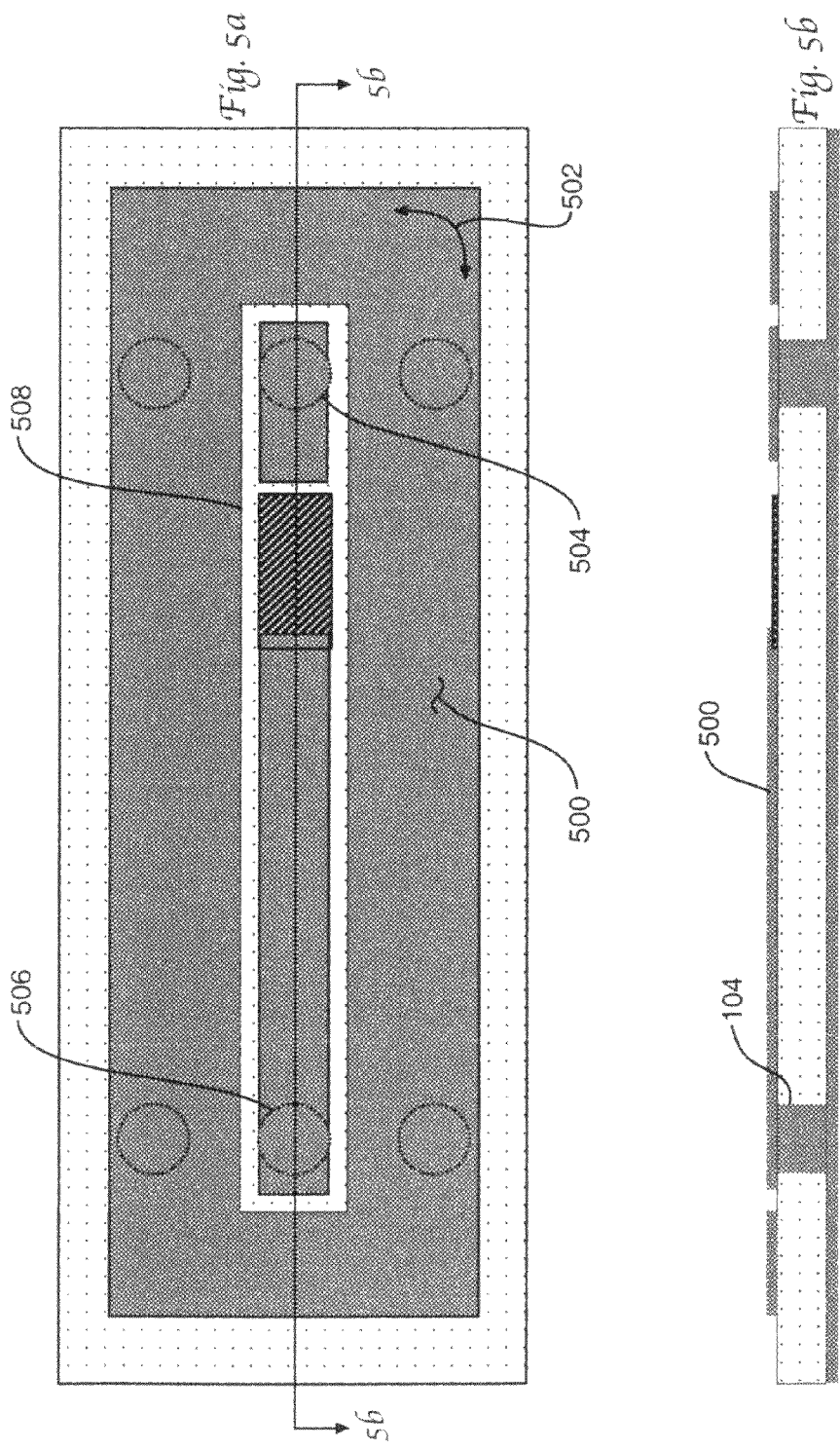
Fig. 5 Pattern, deposit and liftoff RF metal layer (mask 3)

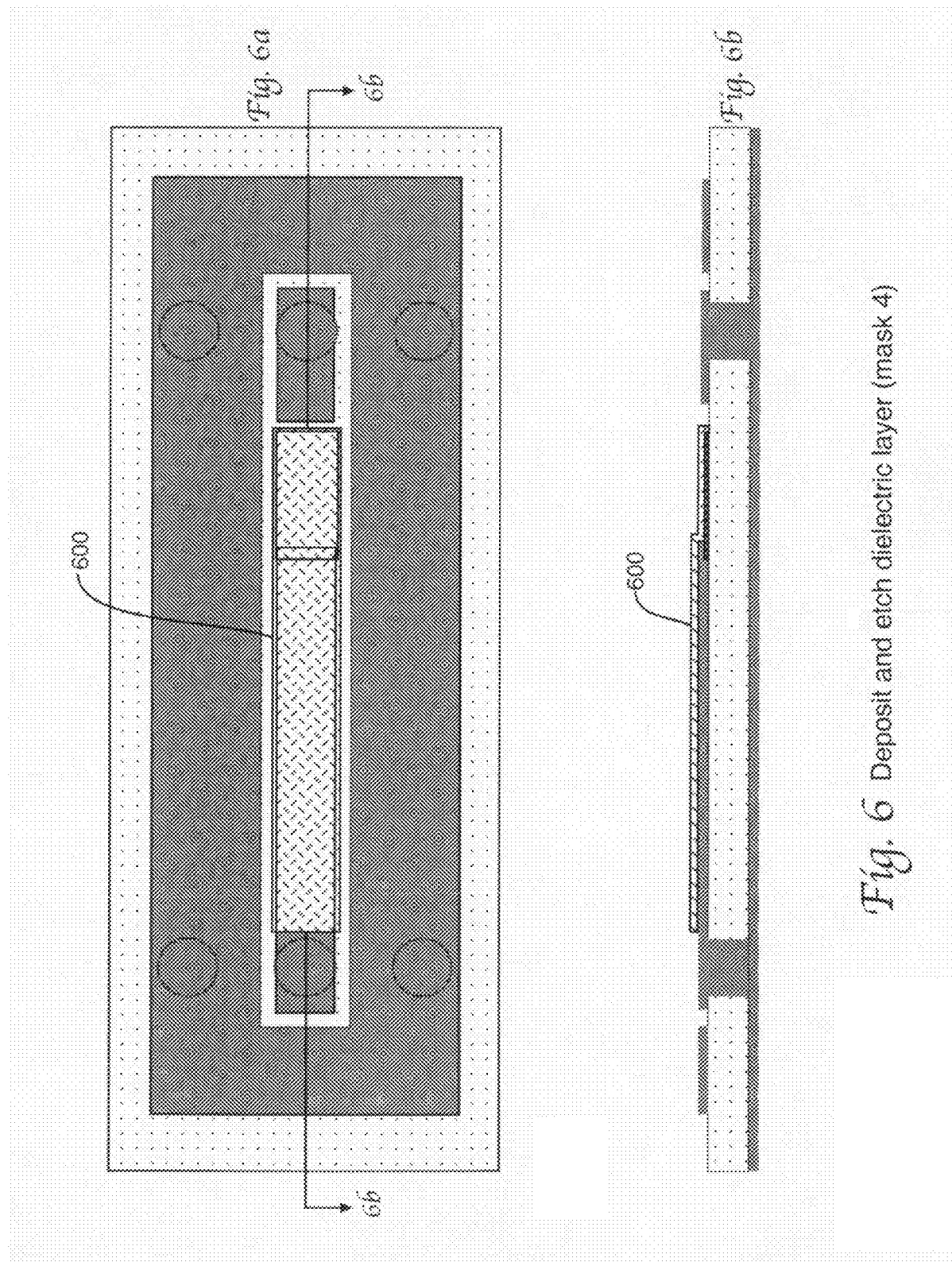

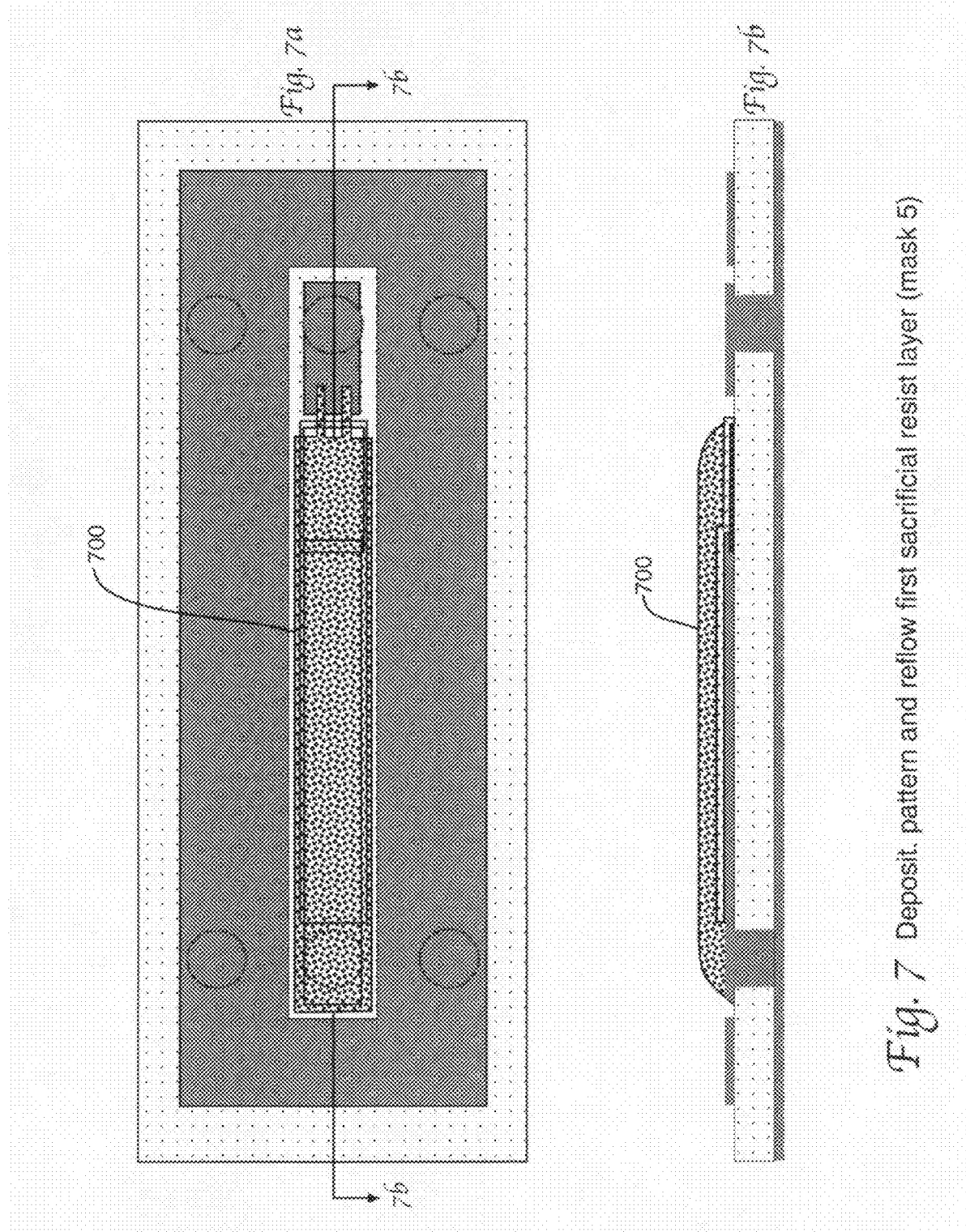

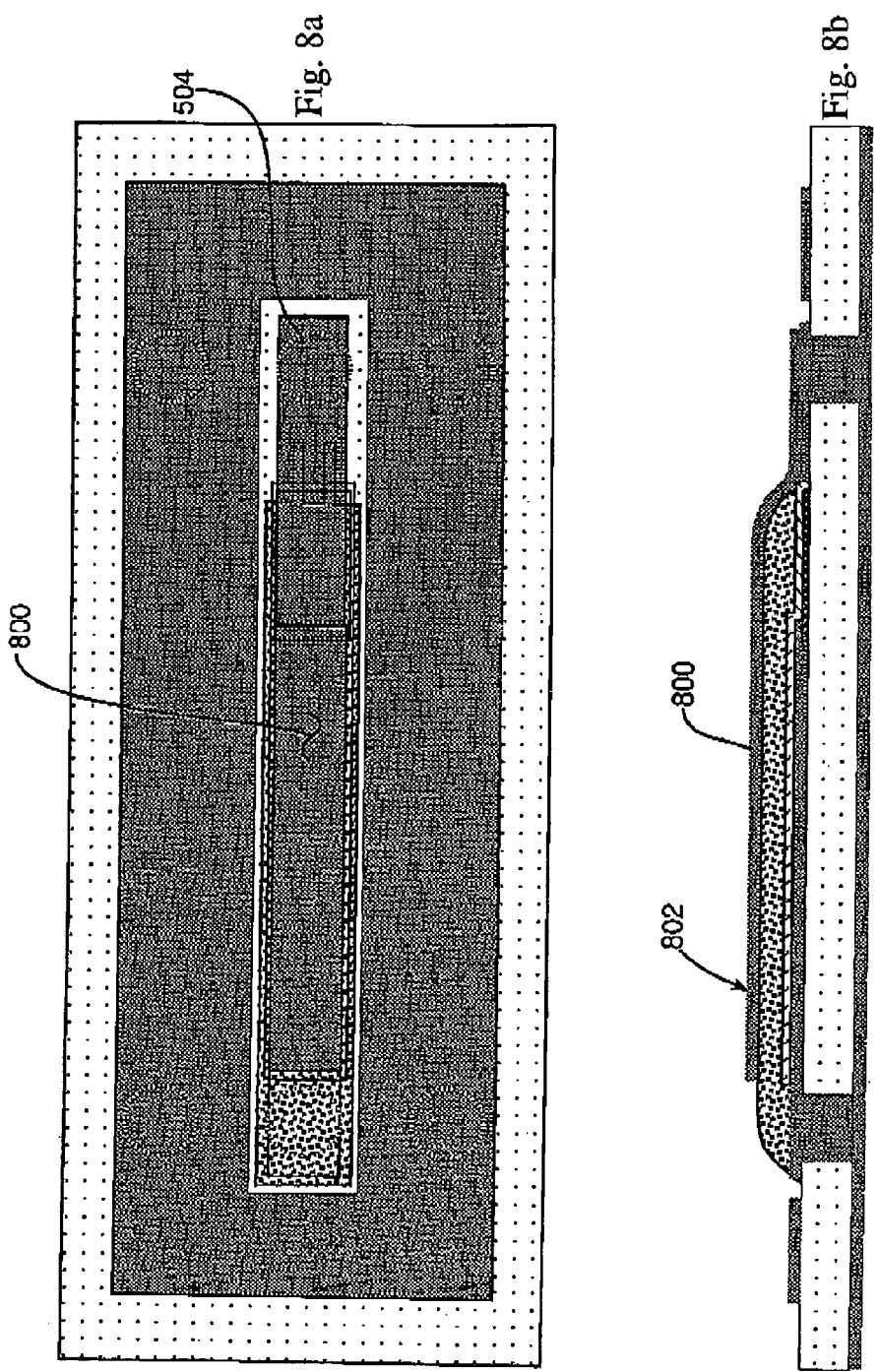
Fig. 8 Deposition of the Switch Bridge (mask 6)

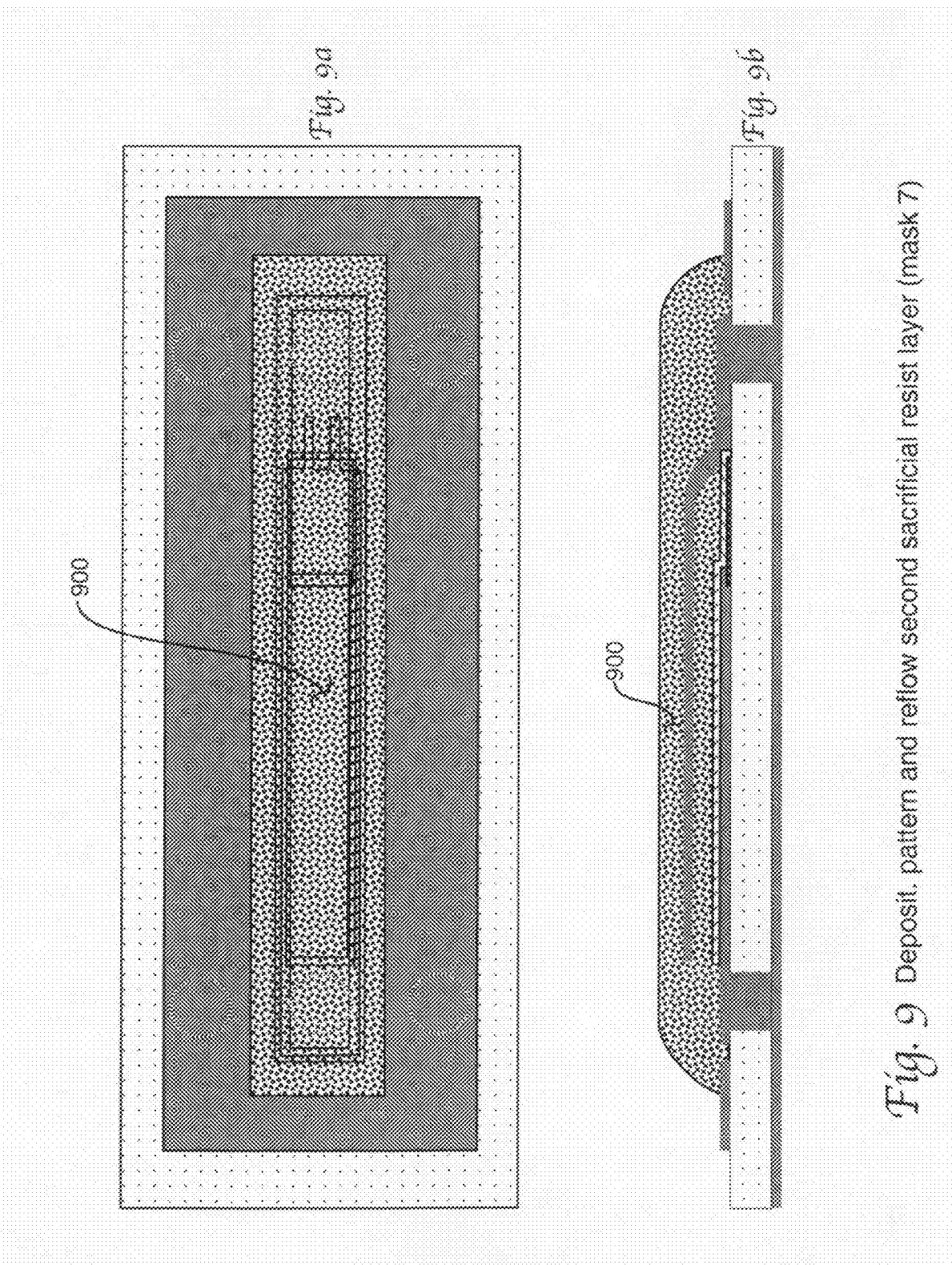
Fig. 9 Deposit, pattern and reflow second sacrificial resist layer (mask 7)

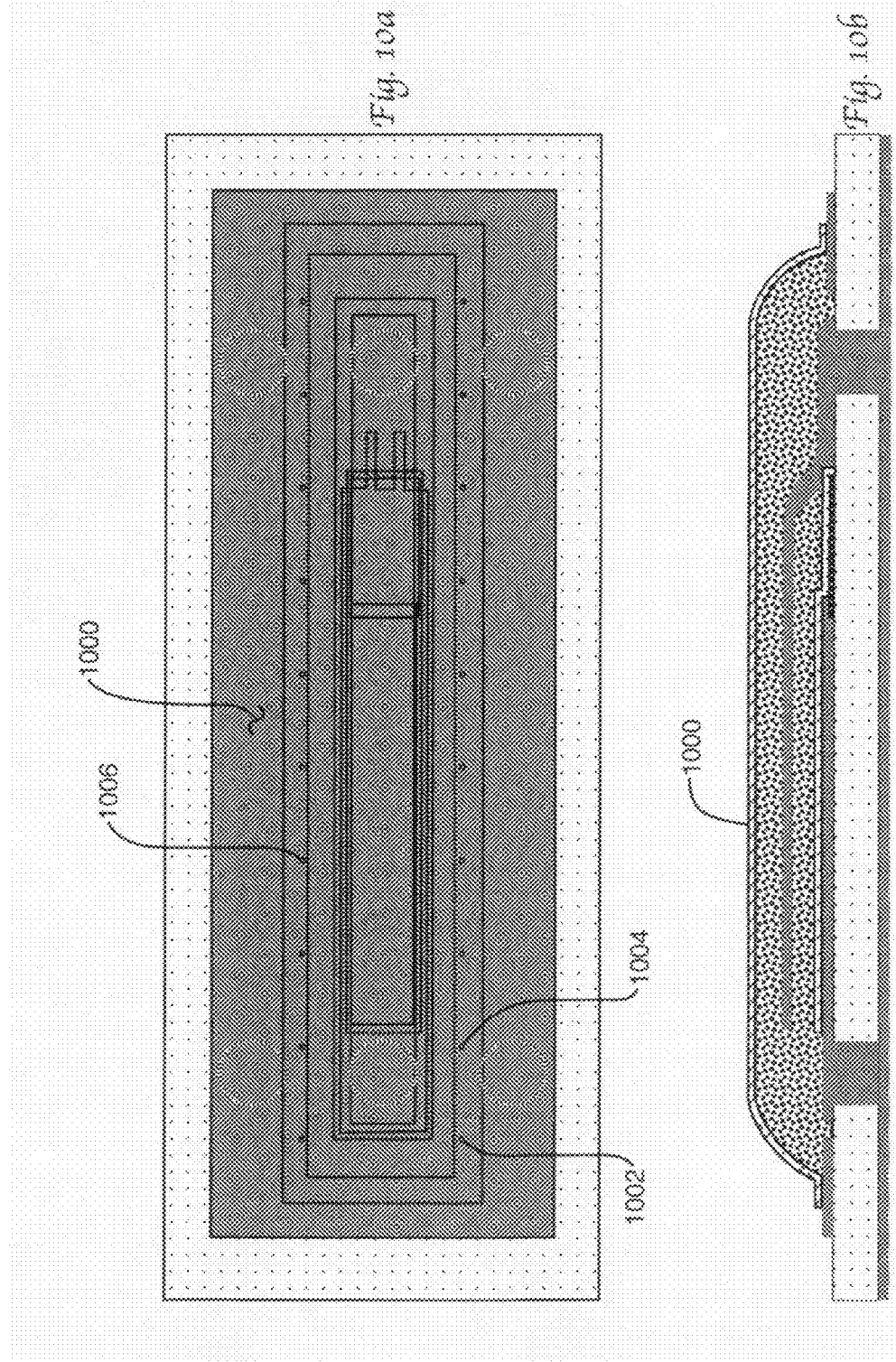
Fig. 10 Deposit and etch dielectric cap layer (mask 8)

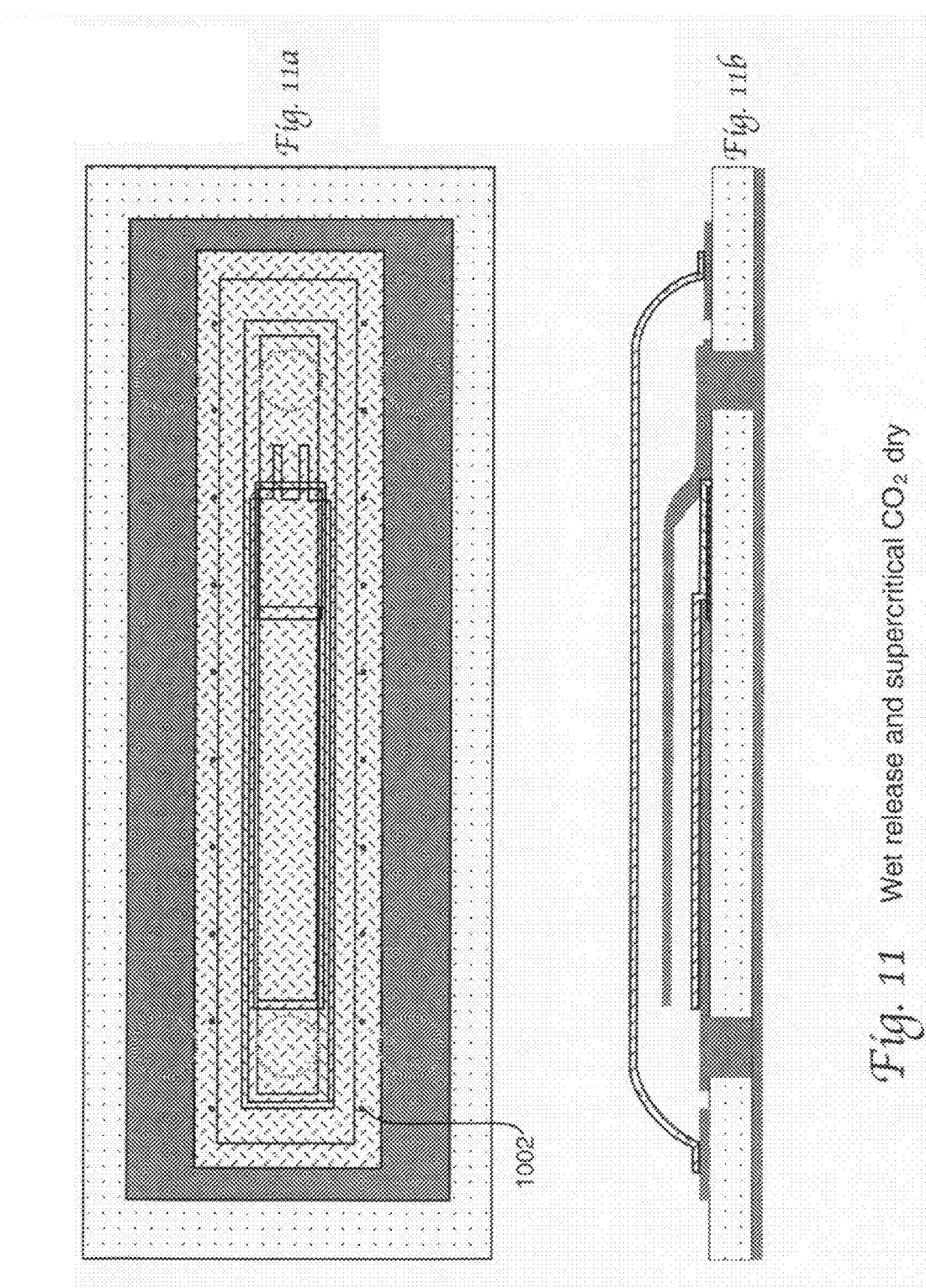
Fig. 11 Wet release and supercritical CO₂ dry

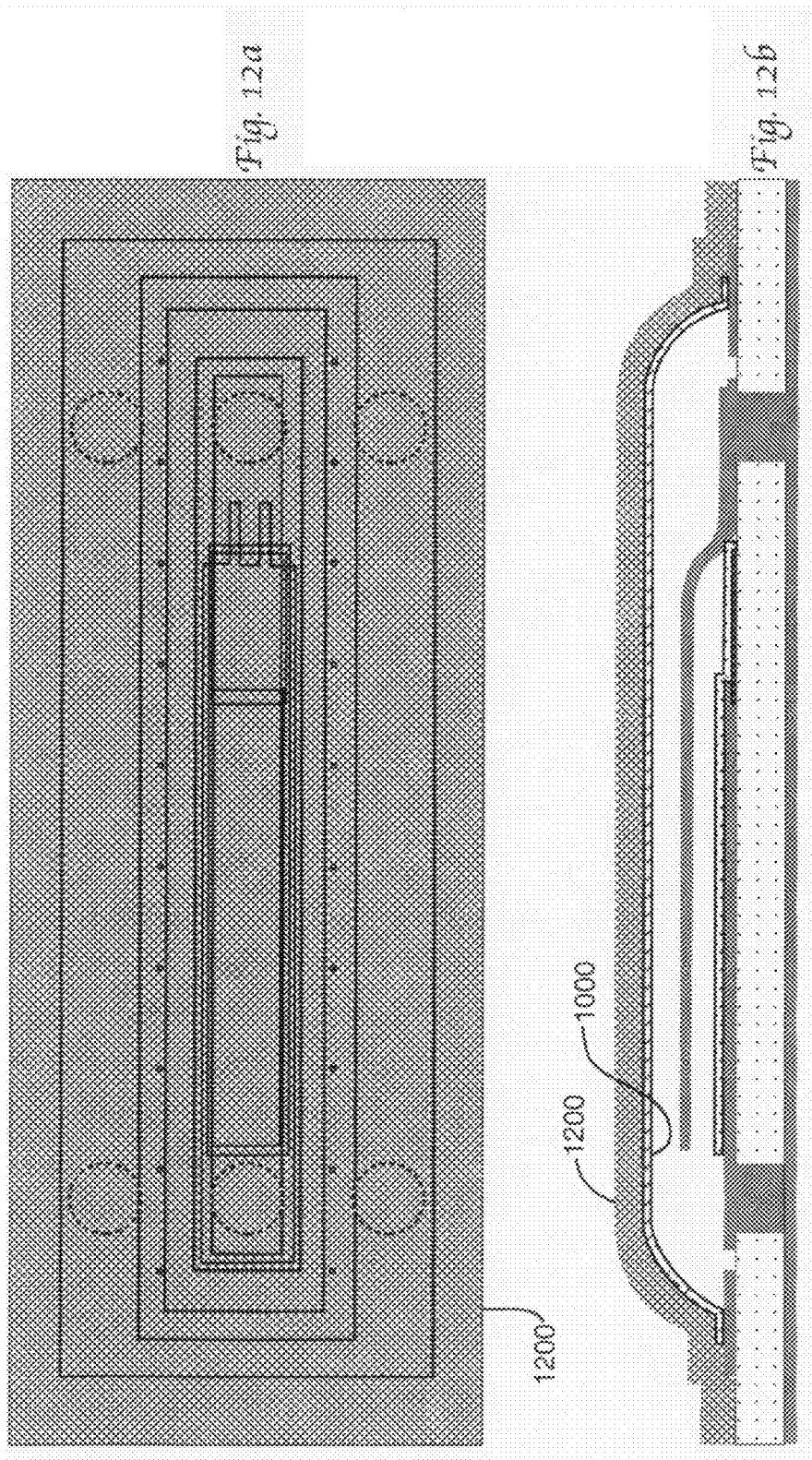
Fig. 12 Deposit thick metal cap seal

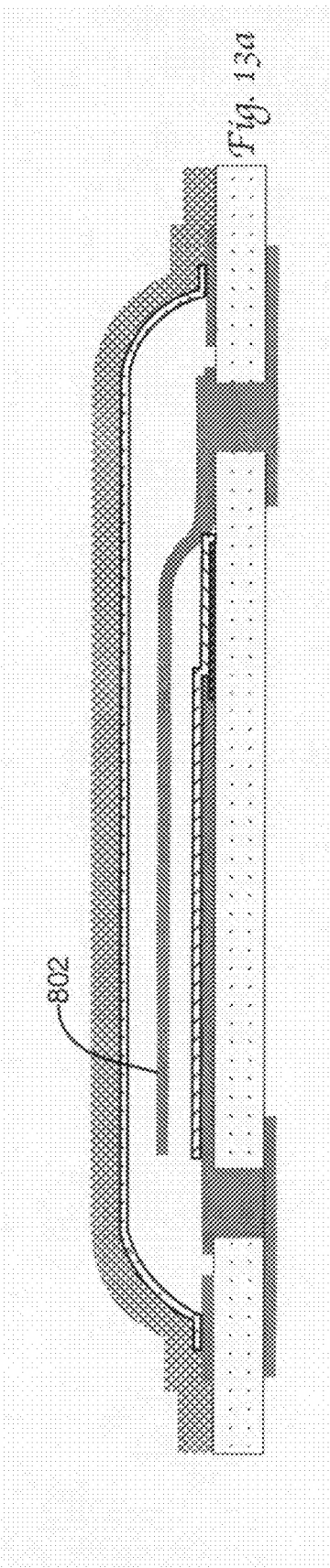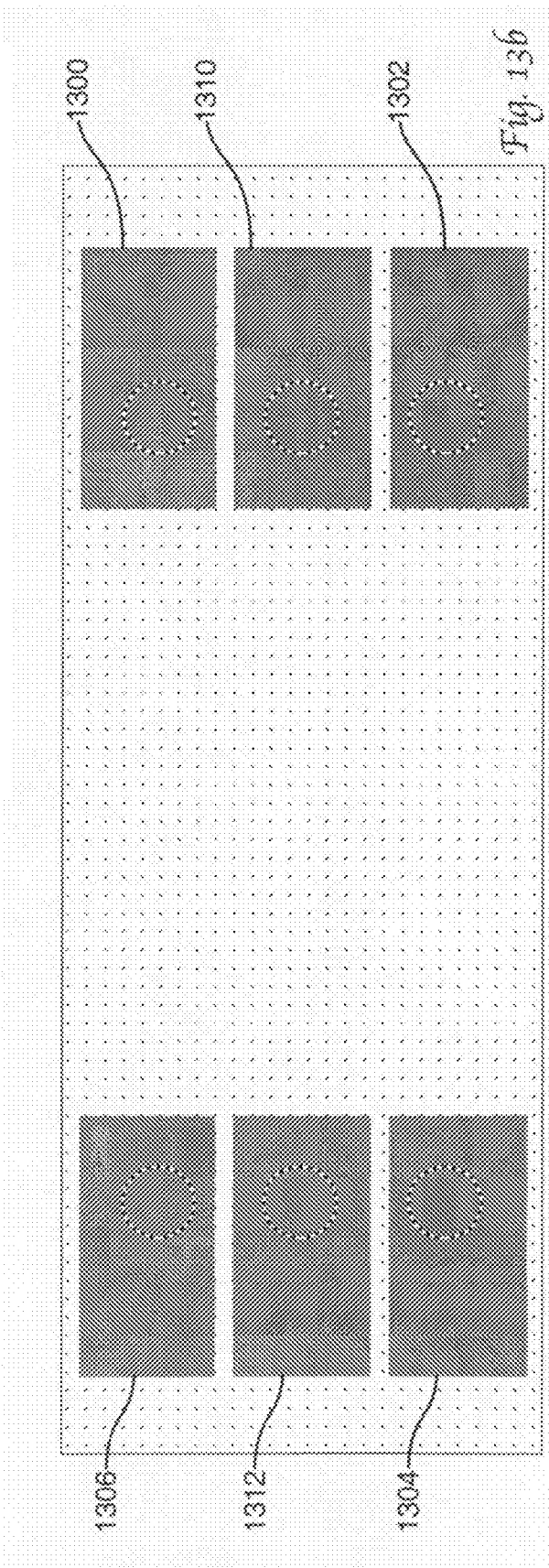
Fig. 13  Pattern backside metal (mask 9)

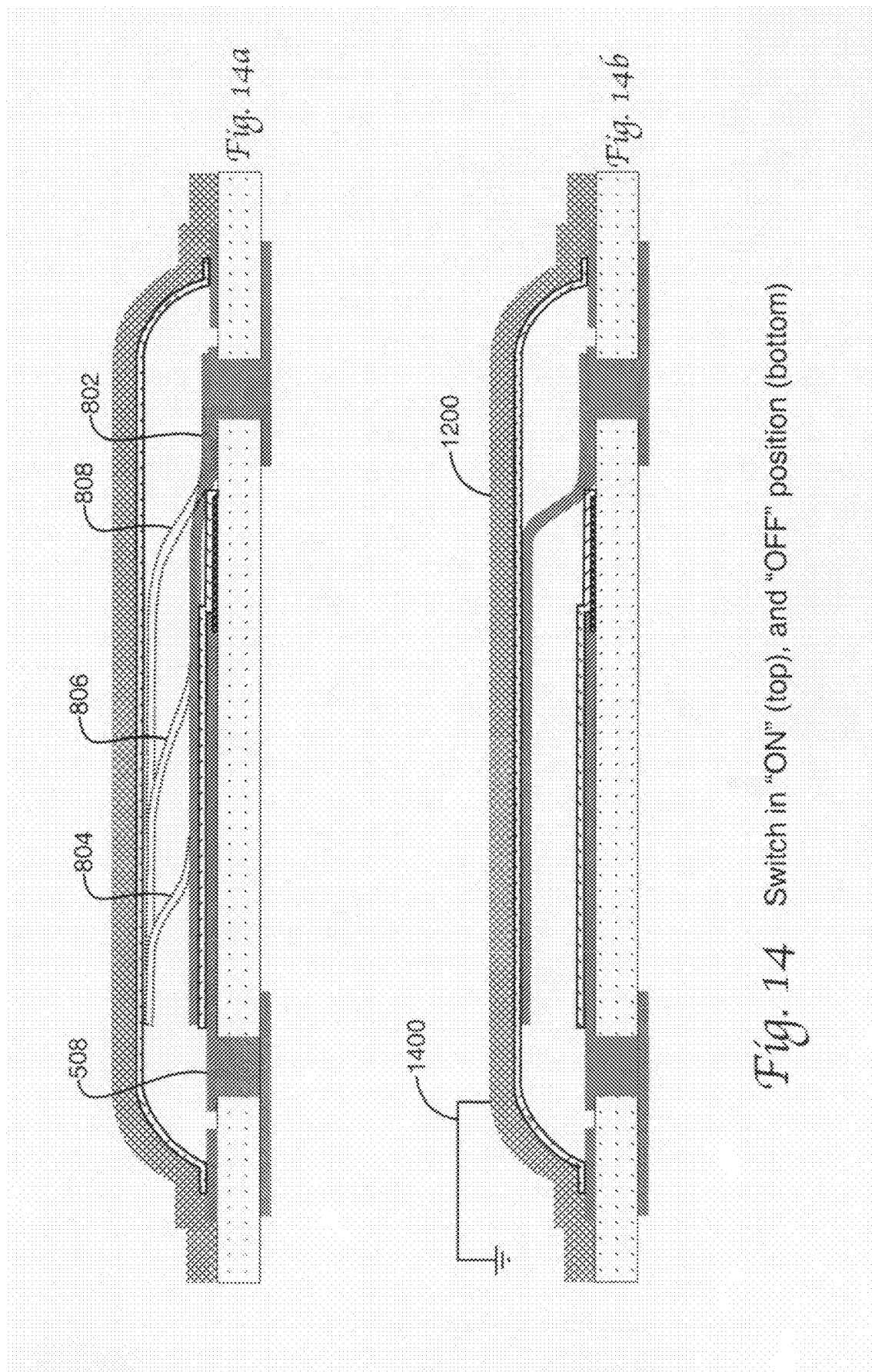
Fig. 14 Switch in "ON" (top), and "OFF" position (bottom)

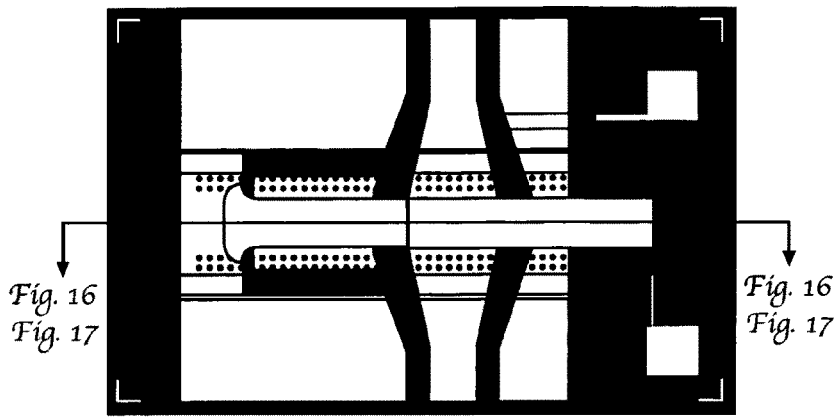
*Fig. 15* Optical Microscope view of device after release
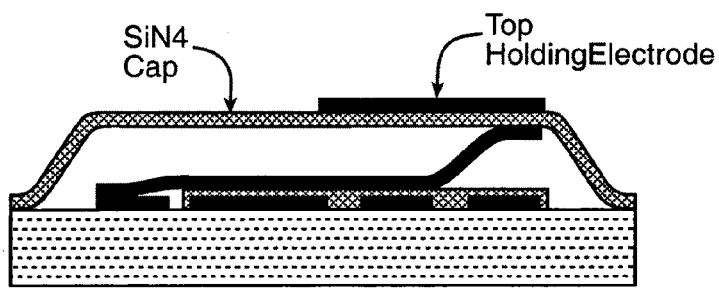
*Fig. 16* Schematic cross-section of device in the OFF-state
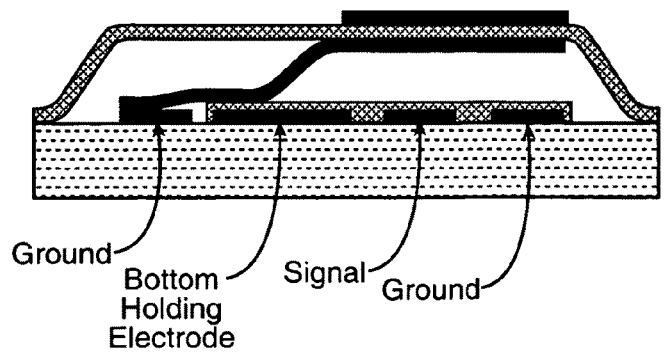
*Fig. 17* Schematic cross-section of device in the ON-state

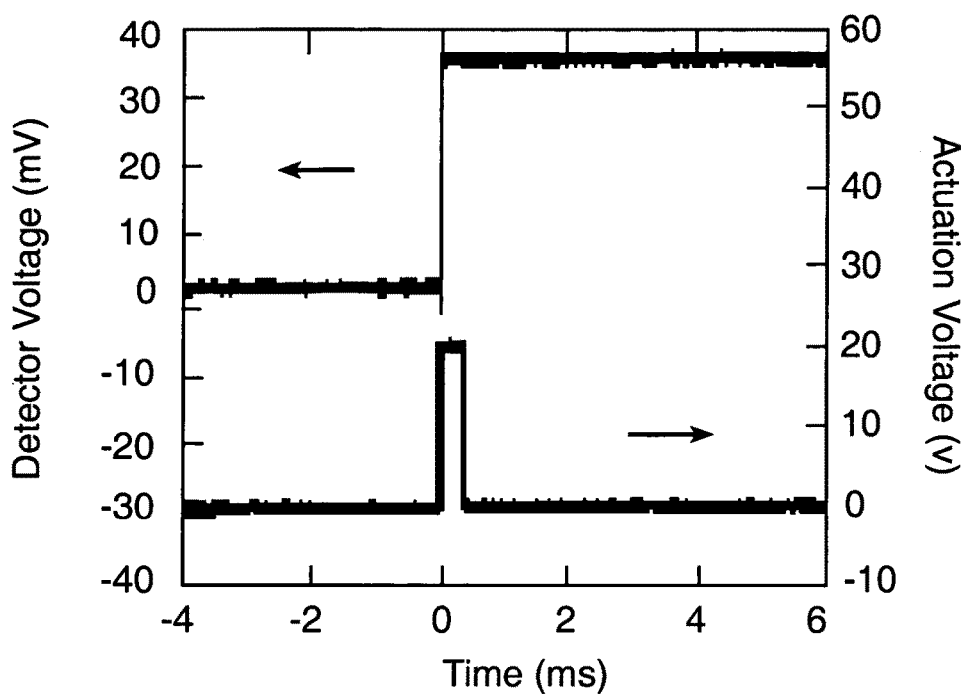
*Fig. 20* Turn-ON and latching
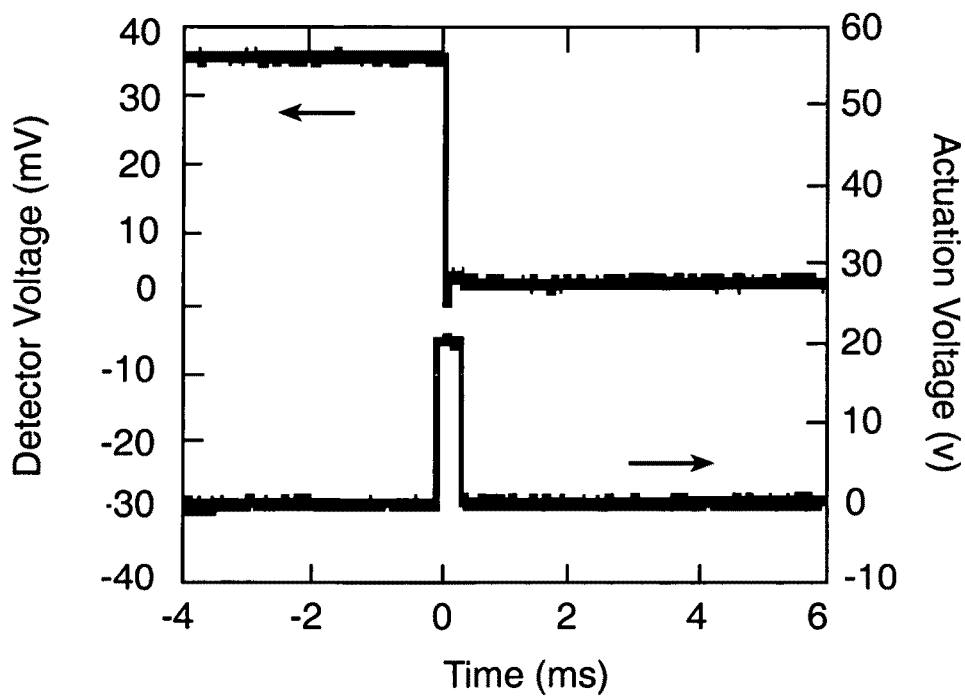
*Fig. 21* Turn-OFF and latching

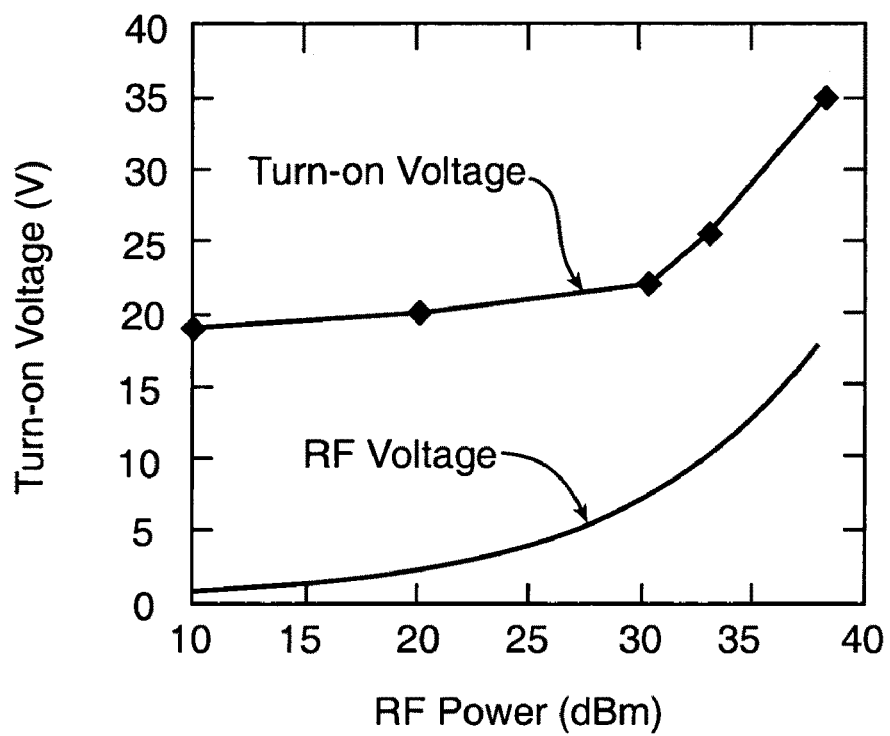
Fig. 22 Turn-on voltage as a function of RF power

LATCHING ZIP-MODE ACTUATED MONO WAFER MEMS SWITCH METHOD

CROSS REFERENCE TO RELATED PATENT DOCUMENTS

The present document is a Continuation In Part of the commonly assigned patent application document "PROCESS INTEGRATED PACKAGING OF RADIO FREQUENCY (RF) MICROELECTROMECHANICAL SYSTEMS (MEMS) SWITCHES", Ser. No. 10/901,315, filed 27 Jul. 2004 now U.S. Pat. No. 7,381,583 with claim of priority to a Provisional Application document of Ser. No. 60/573,892 dated May 24, 2004. The contents of these related application documents are hereby incorporated by reference herein.

The present document is related to the co pending, common file date and commonly assigned U.S. patent application "LATCHING ZIP-MODE ACTUATED MONO WAFER MEMS SWITCH" Ser. No. 12/152,129, filed of even date herewith. The contents of this related application document are also hereby incorporated by reference herein.

Each of the Ser. No. 12/152,129 and Ser. No. 12/152,130 related documents is filed in the names of four inventors: John L. Ebel, Rebecca Cortez, Kevin D. Leedy and Richard E. Strawser. Mr. Strawser is deceased and is represented by his father as Executor.

CLAIM OF PRIORITY

This application claims the benefit of U.S. Provisional Patent Application No. 60/930,357, "THIN FILM ENCAPSULATED RF MEMS SWITCH WITH BIDIRECTIONAL ZIP-MODE ACTUATION", filed on 11 May 2007. The contents of this provisional application are hereby also incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

In the current generation of radio frequency MEMS switches there is need for improvement in the areas of power handling, temperature stability, switching speed, radio frequency switch capacitance ratio, and integration-friendly packaging. The invention described here offers the potential for improved performance in these areas. Although the improvements to be described here are especially relevant to the capacitance coupled radio frequency switch, readers skilled in the MEMS switch art will recognize relevance of several included concepts to the ohmic contact or direct current MEMS switch. The improvements considered here also involve switch processing—including single wafer MEMS device fabrication and consideration of physical protection for a new, thin and fragile, easily destroyed, switch element.

In a conventional spring-force restored MEMS switch, the ability to hot-switch radio frequency (RF) power is often limited by radio frequency (RF) latching of the device. RF latching occurs when the holding force created by applied RF signal voltage exceeds the restoring spring-force of the switch beam or bridge or movable arm member. For typical capacitive switches, RF hot-switching power is realistically limited to less than about 1 watt. Even at such moderate power, the lifetime of a switch will often be reduced because the presence of the RF voltage reduces the amount of dielectric charging the switch can sustain before failure. Although many system applications do not require hot-switching, a switch that is capable of hot switching can simplify the design of a system using the switch.

Operation over wide temperature ranges is another concern for RF MEMS switches. In devices using a metal bridge, a significant fraction of the spring constant typically arises from Tension in the beam. If the thermal expansion coefficients of the beam and substrate are not well matched, the spring constant will vary significantly with temperature. This temperature-induced variation in spring constant reduces the safe operating margins of the device because the device must be stiff enough to operate at high temperature, but not so stiff that the operating voltage is excessive at low temperature.

Switching speed of the RF MEMS switch is determined by the net actuator force, the mass of the moving structure, the distance the structure moves, and the damping of the atmosphere surrounding the moving structure. In the zip-mode or touch-mode or S-shaped switch arm MEMS switch of special interest in the present invention, the net actuator force can be further increased by removing the opposing spring force of the moving beam. Optimization of the switching speed can be completed by making the moving beam less massive, and by removing the damping atmosphere surrounding the beam. Unfortunately however, for most spring-force restored devices, their relatively high mechanical Q-factors result in many milliseconds of ringing upon opening when operating in even moderate vacuum.

For parallel-plate actuated spring-force restored RF MEMS devices, there is a critical trade-off between operating voltage, restoring force, and capacitance ratio. For devices operating at the same voltage, the restoring force of the device can be increased by decreasing the open-state gap and increasing the beam spring constant. As a result, the increased restoring force required for reliable operation is achieved by reducing the on-state to off-state capacitance ratio of the device.

Finally, the packaging scheme for an RF MEMS switch should be compatible with a monolithic microwave integrated circuit practices for applications such as phase shifters, switchable filters, and signal routing networks. Ideally, the packaging approach used should have low RF losses, should be implemented using standard fabrication processes, and should protect the switching component elements from the environment before the device leaves the clean fabrication area. A thin-film packaging approach as described herein meets all of these goals. In addition, a device that can operate in a low pressure environment allows sealing of the thin-film package by a wider range of vacuum deposition techniques than would be available for devices requiring gas damping.

With respect to the current state of the MEMS switch art it is notable that non-RF devices using S-shaped actuators have been previously demonstrated by Shikida et al. as is disclosed in the reference paper identified in the disclosure filed with the present patent document. Additionally a Gold-contact RF switch using an S-shaped actuator has been disclosed previously by Oberhammer et al. as is similarly disclosed; this device achieves an insertion loss of 2.8 dB and an isolation of 30 dB at 15 GHz. In both of these instances however, the S-shaped actuator is formed through use of a double a wafer-bonding process rather than on a single wafer and the benefits of new self latching switch operating mode disclosed herein appear to have been unrecognized.

SUMMARY OF THE INVENTION

The present invention therefore provides a latching, zip-mode actuated, mono wafer MEMS switch process.

It is therefore an object of the present invention to provide processing for a latching, zip-mode actuated, mono wafer MEMS switch in which the advantages of a single wafer fabrication are made available.

It is another object of the invention to provide a zip-mode actuated, mono wafer MEMS switch in which the processing advantages of a self latching switch are provided.

It is another object of the invention to provide a process for a MEMS switch in which the advantages of an ultra thin and flexible switch beam member operating in the S-shaped or zip mode are realized.

It is another object of the invention to disclose a MEMS switch fabrication in which an ultra thin and flexible zip mode switch beam member can be protected from physical damage during switch fabrication.

It is another object of the invention to disclose a MEMS switch fabrication arrangement in which the ultra thin and flexible zip mode switch beam member is released from protective captivity only within a permanent protective enclosure.

These and other objects of the invention will become apparent as the description of the representative embodiments proceeds.

These and other objects of the invention are achieved by an integrated circuit process compatible method of making a zip-mode actuated, mono wafer MEMS electrical switch, said method comprising the steps of:

assembling multiple sub layers of said switch on an insulating substrate member, said sub layers including an exposed first sacrificial layer;

fabricating a fragile, thin film, low spring constant, movable switch wiper arm member of said switch on said first sacrificial layer;

covering said movable switch wiper arm and said multiple sub layers with a second sacrificial layer to form a stack assembly;

overlaying said stack assembly with an enclosing perforated shield member;

removing said sacrificial layers from said stack assembly via perforations in said perforated shield member and a liquid removal sequence;

said removing step releasing said fragile, thin film, low spring constant, movable switch wiper arm member from sacrificial layer captivity within protective confines of said enclosing perforated shield member;

sealing said shield member perforations with an externally applied material;

whereby said released, fragile, thin film, low spring constant, movable switch wiper arm member is susceptible to S shaped profile, zip mode, actuation by control electrodes attending said multiple sub layers and said enclosing perforated shield member.

BRIEF DESCRIPTION OF THE DRAWINGS

The accompanying drawings incorporated in and forming a part of this specification, illustrate several aspects of the present invention and together with the description serve to explain the principles of the invention. In these drawings:

FIG. 1a shows a plan view of a starting step for a present invention MEMS switch.

FIG. 1b shows profile view of a starting step for a present invention MEMS switch.

FIG. 2a shows a plan view of a mask 1 first fabrication step for a present invention MEMS switch.

FIG. 2b shows a profile view of a mask 1 first fabrication step for a present invention MEMS switch.

FIG. 3a shows a plan view of a second fabrication step for a present invention MEMS switch.

FIG. 3b shows a profile view of a second fabrication step for a present invention MEMS switch.

FIG. 4a shows a plan view of a mask 2 fabrication step for a present invention MEMS switch.

FIG. 4b shows a profile view of a mask 2 fabrication step for a present invention MEMS switch.

FIG. 5a shows a plan view of a mask 3 fabrication step for a present invention MEMS switch.

FIG. 5b shows a profile view of a mask 3 fabrication step for a present invention MEMS switch.

FIG. 6a shows a plan view of a mask 4 fabrication step for a present invention MEMS switch.

FIG. 6b shows a profile view of a mask 4 fabrication step for a present invention MEMS switch.

FIG. 7a shows a plan view of a mask 5 fabrication step for a present invention MEMS switch.

FIG. 7b shows a profile view of a mask 5 fabrication step for a present invention MEMS switch.

FIG. 8a shows a plan view of a mask 6 fabrication step for a present invention MEMS switch.

FIG. 8b shows a profile view of a mask 6 fabrication step for a present invention MEMS switch.

FIG. 9a shows a plan view of a mask 7 fabrication step for a present invention MEMS switch.

FIG. 9b shows a profile view of a mask 7 fabrication step for a present invention MEMS switch.

FIG. 10a shows a plan view of a mask 8 fabrication step for a present invention MEMS switch.

FIG. 10b shows a profile view of a mask 8 fabrication step for a present invention MEMS switch.

FIG. 11a shows a plan view of a beam release and drying sequence for a present invention MEMS switch.

FIG. 11b shows a profile view of a beam release and drying sequence for a present invention MEMS switch.

FIG. 12a shows a plan view of a cap sealing sequence for a present invention MEMS switch.

FIG. 12b shows a profile view of a cap sealing sequence for a present invention MEMS switch.

FIG. 13a shows a plan view of a mask 9 backside metal fabrication step for a present invention MEMS switch.

FIG. 13b shows a profile view of a mask 9 backside metal fabrication step for a present invention MEMS switch.

FIG. 14a shows a switch ON plan view of a completed present invention MEMS switch.

FIG. 14b shows a switch OFF plan view of a completed present invention MEMS switch.

FIG. 15 shows a simulated microscope image of a completed alternate MEMS switch.

FIG. 16 shows a profile view of the completed alternate MEMS switch in the OFF state.

FIG. 17 shows a profile view of the completed alternate MEMS switch in the ON state.

FIG. 20 shows the turn ON and latching characteristics for a MEMS switch according to the present invention.

FIG. 21 shows the turn OFF and latching characteristics for a MEMS switch according to the present invention.

FIG. 22 shows the effect of switched radio frequency energy on the turn ON characteristics of a present invention MEMS switch.

DETAILED DESCRIPTION

Figure 18:
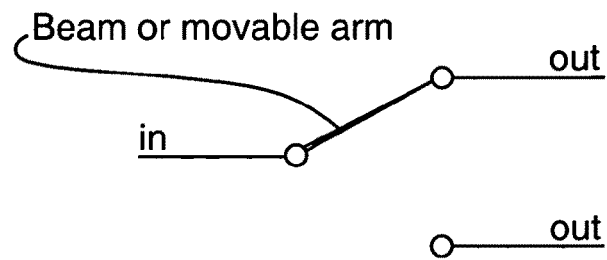
FIG. 18 shows the components of a single pole double throw switch in schematic form.

FIG. 1 through FIG. 14 in the drawings shows a sequence of integrated circuit compatible fabrication steps for a MEMS switching device according to the present invention. Subsequent drawings included herein show characteristics and alternate switch structural views for MEMS switches according to the invention. A notable aspect of the fabricated MEMS device is the single wafer achievement of a latching zip-mode actuated MEMS switch especially suited to capacitance coupled switching of radio frequency signals. The self latching capabilities of this switch are also of significant interest.

The FIG. 1-FIG. 14 devices may be fabricated on a single silica or sapphire substrate by a sequence of specific steps commencing with the backside metal 102 covered wafer 100 as is shown in the FIG. 1a and FIG. 1b drawings. The FIG. 1a and FIG. 1b drawings represent plan and profile views of the wafer 100 in a conventional manner as may be appreciated from the indicating line 108 and the related drawing identification symbol 110. A similar relationship prevails for each of the "a" and "b" drawings in the FIG. 1-FIG. 14 group herein. A first fabrication mask may be used to etch a series of via apertures 104 and 106 down to the metal 102 in the silica or sapphire substrate 100 as is shown in the FIG. 2a and FIG. 2b (i.e., the FIG. 2) drawings. Via metal 110 may then be plated through the via apertures 104 and 106 as appears in the FIG. 4 drawings.

A second fabrication mask may be used to deposit and etch a resistor material 400 into the substrate 100 material as also appears in the FIG. 4 drawing. The resistive material 400 may be of greater than 10000 ohms per square electrical characteristics and is used for the purpose of initiating the switching transition by providing high DC capacitance between the lower electrode 500 and the moving arm 800, while at the same time blocking radio frequency signal propagation providing increased switch isolation. The resistor material 400 may be sputtered Tungsten Silicon Oxide (WSiO). A layer of radio frequency signal conducting metal 500 is deposited, patterned and shaped by liftoff as shown in the FIG. 5 drawings and provided by use of a third mask. This metal may be of a thickness of 200 nanometers to 600 nanometers. As may be observed in the FIG. 5 drawing several of the FIG. 2 via apertures 104 are used to provide low impedance access to the surrounding metal, and later grounded, ring 502 of this radio frequency metal. A central pair of via apertures 504 and 506 is used for access to the movable arm or bridge member and to a fixed contact portion 508 of the switch being fabricated respectively.

A thin layer of dielectric material is then provided over the fixed contact portion 508 of the switch as appears in the FIG. 6 drawings and as is provided by mask 4 in the fabrication set. This dielectric layer may be $Si_3N_4$ (250 nm) fabricated in a PECVD sequence. A Freon® 14 dry etch may be applied.

A mask 5 of the switch fabrication set may then be used to deposit a mass of first sacrificial material, 700 in the FIG. 7 drawing, over the radio frequency metal and dielectric layer 600. This sacrificial layer may be of 0.5 micrometers thickness and is used to support the ensuing ultra thin and fragile layer of switch bridge or movable arm metal. The thinness of the first sacrificial layer 700 causes the root of the moving arm 800 to be closer to the resistor 400, facilitating the capacitive coupling between the resistor and the moving arm providing faster and lower-voltage switching when the arm is moving toward the lower electrode. The sacrificial material 700 may be of a photoresist material nature such as Polymethylglutarimide (PMGI). The dielectric layers 600, 1000 provide DC isolation for electrostatic actuation, provide radio frequency signal coupling to the lower electrode 506 and upper electrode 1200, and are intended to have the characteristic of retaining some small residual electrical charge to securely latch the moving arm into the "ON" and "OFF" states.

Deposition of the switch bridge or movable arm metal 800 is represented in the FIG. 8 drawings where a mask 6 of the fabrication set is used. The metal 800 may be of Gold composition and may have an ultra thin thickness in the range of 500 to 750 nanometers or 0.5 to 0.75 micron. The rightmost extremity of this bridge metal is shown in the FIG. 8a drawing to reside in contact with metal in the via aperture 504 in order to provide electrical access to this element of the switch. The elongated extent of this metal 800 as it extends leftward in the FIG. 8 drawing and its thin extent are of special interest with respect to the desired zip action movement of this element during switch operation. This and other aspects of the switch bridge element metal 800 and the MEMS movable arm member 802 this metal comprises are addressed subsequently herein.

A second mass 900 of sacrificial material such as photoresist may be used as shown in the FIG. 9 drawing to cover the switch movable arm metal 800 and thus provide for its complete physical protection notwithstanding its thin fragile nature until later in the fabrication process. This second sacrificial layer may be of 3 to 10 micrometers in thickness and is controlled in extent by a mask 7 of the fabrication process.

Mask 8 of the process is used to provide for the sputtered deposition of a dielectric cap layer member 1000 over the sacrificial mass 900 as appears in the FIG. 10 drawing. This cap layer 1000 is provided with a series of holes through which liquid reactant materials may later enter and leave the dielectric material enclosed space. The dielectric material 1000 serves the same DC isolating, radio frequency coupling, charge retaining purposes as the dielectric layer 600 applied in the FIG. 6 drawing herein in the completed MEMS device. The dielectric layers 600 and 1000 in the present invention of course serve also to preclude actual ohmic contact of the movable arm member 802 with either the lower or upper contact conductors. The dielectric layer 1000 is preferably achieved with a sputtering application of $Si_3N_4$ to a thickness of about 250 nm for the device in FIG. 10 or 1.7 micrometers for the alternate device in FIG. 15.

In the FIG. 11 drawing use of the dielectric cap layer apertures 1002, 1004, 1006 and so-on for removal of the sacrificial material layers 700 and 900 from within the dielectric material cap layer 1000 is represented. This removal is accomplished with use of a sacrificial photoresist reactive material such as N-Methyl-2-Pyrrolidone (NMP) and frees the thin and fragile MEMS switch bridge or movable arm member 802 from its captivity and protection within the sacrificial layers. This liquid based removal and freeing of a fragile thin switch movable arm member, while within a protective cap layer 1000 housing, is believed a significant step in the MEMS process being described.

Drying of the components within the cap layer 1000 housing is also represented in the FIG. 11 drawing; this drying may be accomplished with carbon dioxide supercritical fluid and extracts all but minute quantities of moisture remaining after removal of the sacrificial layers. The term "supercritical drying" is used to describe this FIG. 11 drying in view of the transition from liquid to gas above the thermodynamic critical point for carbon dioxide during the drying process. For the device in FIG. 14, the sealing metal is the top electrode. For the device in FIG. 15, the seal can be accomplished by another dielectric layer deposition which is not shown in FIG. 15-17.

FIG. 12 in the drawings shows the application of a thick metal cap 1200 over the dielectric cap layer 1000 in order to capture the dried switch components within a permanent enclosure. This permanent enclosure of course seals the dielectric cap layer apertures 1002, 1004, 1006 and so-on and removes the switch components from atmospheric effects.

The thick metal cap 1200 also provides an electrical ground connection that is within movement range of the switch movable arm member 802 and therefore influences a significant part of the electrical characteristics of the fabricated MEMS device switch.

Use of a mask 9 in the MEMS fabrication set to pattern the backside metal layer 102 of the wafer 100 is represented in the FIG. 13 drawing. The lands 1300, 1302, 1304 and 1306 formed by this FIG. 13 metal patterning provide low impedance, high frequency, connections, by way of respective vias, with the metal surrounding the movable switch arm member and thus allow the thick metal cap 1200 to be effectively grounded at even the microwave frequencies contemplated during many uses of the fabricated MEMS switch. The lands 1310 and 1312 provide access to the switch movable arm and fixed contact elements as may be best appreciated in the FIG. 13*a* drawing.

FIG. 14 of the drawings shows the heretofore fabricated MEMS switch in a finished condition and in two differing operating positions. In the FIG. 14*a* drawing the finished switch is shown to be in a switch closed condition wherein a maximum degree of preferably capacitance determined microwave signal coupling exists between the fixed contact member 508 and the movable arm member 802. In the FIG. 14*b* drawing the finished switch is shown to be in a switch open condition wherein a minimum degree of this microwave signal coupling exists between the fixed contact member 508 and the switch movable arm member 802.

The FIG. 14*a* drawing also illustrates by the dotted curves 804, 806 and 808 several of the numerous S-shaped curvature positions a switch movable arm member 802 may assume during a switch transition between closed and open conditions. These different S-shaped curvature positions are in accordance with the zip mode or zipper mode actuation contemplated for the described switch. These positions represent a time sequence of positions the movable arm member 802 assumes following an opening or closing event initiation. This curvature action in the movable arm member 802 is often spoken of as a significant addition or improvement with respect to the conventional rigid-beam MEMS switch operating arrangement and is enabled inter alia by the elongated and thin flexible characteristics of the movable arm member 802 in the present invention switch.

The electrically grounded nature of the thick metal cap 1200 indicated at 1400 in the FIG. 14 drawing indicates that the movable arm member 802 moves between a signal shunting or essentially grounded condition while in the OFF position shown in FIG. 14*b* and a signal coupling to the fixed contact member 508 while in the ON position shown in the FIG. 14*a* drawing. This action is in accordance with the characteristics found in the conventional single pole double throw electrical switch, the switch shown schematically in the FIG. 18 drawing herein, with the exception that one of the double throw switch output nodes has thus far been described as being connected with ground herein. This grounded connection of course has significant advantages when the present invention MEMS switch is operated in the capacitance coupled microwave signal realm since undesired signal coupling through the switch is minimized by ground shunting action.

In lower frequency operation of the herein described MEMS switch it is also possible to achieve useful switch characteristics with elimination of the ground connection indicated at 1400 in FIG. 14. In fact either a separate elevated fixed switch contact or a non-grounded metal shell member 1200 serving as such an elevated fixed contact member may be used to achieve this ground isolated switching where operation of the large surface area of the metal shell member 1200 at significant signal potential levels is not objectionable. Operation of a MEMS switch device according to the present invention in the ohmic contact switching mode is also possible. This operation provides for coupling of lower frequency signals without reliance on capacitance between switch electrodes and of course produces minimal signal losses in the switch when direct current or low frequency signals are involved.

An optical microscope representation of a differing but related MEMS switch device after its release from sacrificial material captivity is shown in the FIG. 15 drawing herein. The bowed vertical lines in this drawing represent the ground-signal-ground microwave signal transmission line components. The root end of the FIG. 15 switch cantilever can be seen through the $Si_3N_4$ cap in the left side of the FIG. 15 image. Two rows of release holes in the cap run above and below along either side of the switch cantilever in this drawing. The diameter of the release holes is nominally 4 microns. The image in FIG. 15 is a top-view of the device looking through the transparent silicon nitride cap material. The cross-sections in FIG. 16 and FIG. 17 represent a cut down the center of the moving arm from left to right in FIG. 15 as is shown by a cutting line. The square pad in the lower right of FIG. 15 is connected to the top holding electrode, and the pad in the upper right is connected to the center signal line through a radio frequency blocking resistor. The bottom holding electrode is also connected to the center signal line through a resistor so that a DC bias applied to, the upper-right pad is conveyed to both the center signal line and the bottom holding electrode.

A schematic cross-section of the similar but different MEMS switch device shown in FIG. 15 is shown in each of the FIG. 16 and FIG. 17 drawings herein—in the OFF and ON states respectively. The lower holding electrode in these drawings is 250 um long and is connected to an RF signal line through a 20 kilo ohm resistor—as is embodied at 400 in FIG. 4 of the previous device fabrication description. The FIG. 16 and FIG. 17 cantilever is 90 micrometers by 800 micrometers, and the signal line is 160 micrometers wide where the cantilever crosses. The S-shaped actuator in this device is maneuvered by pulling the free end of the cantilever up to the upper holding electrode, and pulling the root end down to the lower holding electrode after release. Slight dielectric charging holds the cantilever in either the ON state or OFF-state between switching pulses.

Minute amount of residual surface moisture are also believed to contribute to the static latching effect sought after and achieved in the present invention MEMS devices. Generically these latching effect forces from whatever source may be referred-to as adhesive forces. The device in FIG. 15, 16, 17 is a shunt-only arrangement and uses planar feed-through into and out of the cap. For the device in FIG. 14, the center signal line provides the function of the bottom holding electrode, and the cap metal 1200 provides both the functions of the top holding electrode and the radio frequency transmission line ground. The slight accumulation of electrical charge in dielectric layers 600 and 1000 results in an electrostatic force between the moving arm 800 and the electrodes 500 and 1200; this force is inversely proportional the square of the separation between these electrodes.

Figure 19:
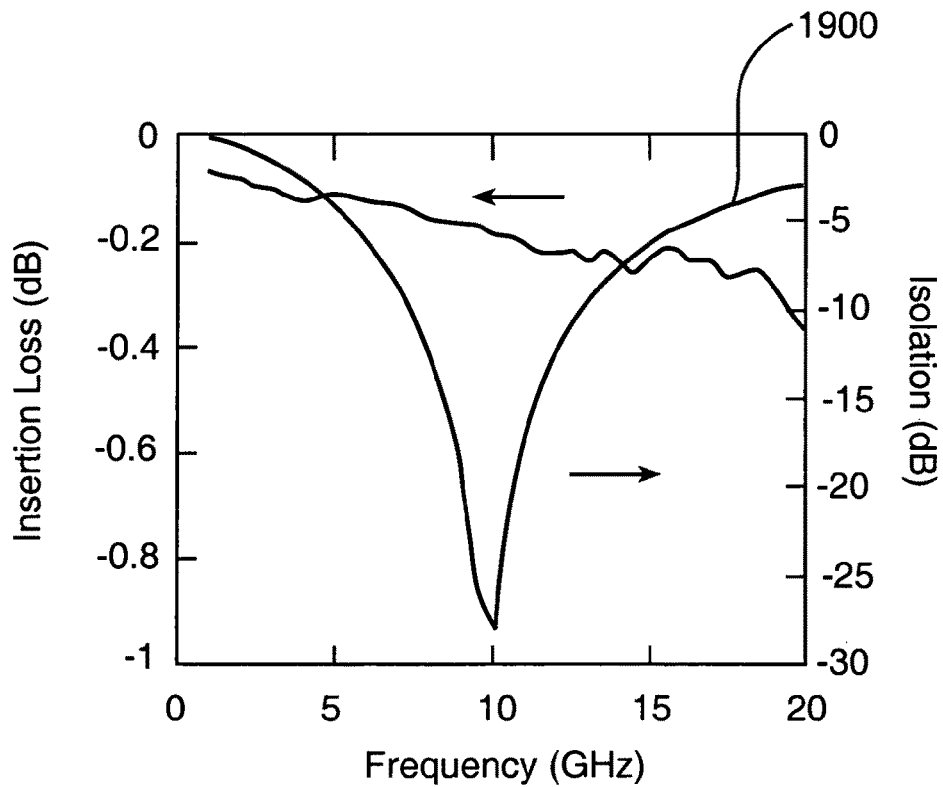
FIG. 19 shows representative S parameter measurements for a MEMS switch according to the present invention.

Both signal losses and signal isolation characteristics in the microwave frequency range of present invention capacitive switch operation are disclosed in the FIG. 19 drawing herein. In this drawing the switch being measured is in the latched condition. The signal loss characteristics curve 1900 in this drawing of course relates to the left hand numeric scale of the drawing and to a closed switch. The measurements shown in FIG. 19 are taken with no bias applied, and the time between latching the device into a particular state and making the s-parameter measurement is greater than one-half hour. In the latched states with no bias the insertion loss is 0.2 dB at 10 gigahertz and isolation is greater than 20 dB in a narrow band around 10 gigahertz. The 10 gigahertz isolation/resonance is caused by the series combination of the cantilever inductance and the shunting capacitance in the path to ground. Location of and magnitude control of this resonance characteristic are of course possible with attention to switch dimensions and other details.

The dynamic latching behavior of the present invention MEMS device is shown in the drawings of FIG. 20 and FIG. 21 herein. These measurements are made with a radio frequency power level of 20 dBm at the device. Turn-on voltage of the FIG. 20 device is measured as a function of radio frequency power up to 38 dBm. As expected, the switch turn-ON voltage increases as the radio frequency power is increased. The FIG. 22 drawing herein shows the measured results for turn-on voltage versus radio frequency power. The turn-OFF voltage does not increase as the RF power increases. Increasing the turn-ON voltage of the device should not greatly accelerate dielectric charging since the upper dielectric layer of the cap is substantially thicker than the lower RF dielectric layer (1.7 micrometers vs. 250 nanometers).

The herein described MEMS switch device has several advantages and new features as compared with device known in the art. Several of these advantages stem from the process of forming the switch cantilever beam between fixed electrodes before release, rather than releasing the cantilever and then assembling the device. Notable attributes include:

The described thin-film encapsulation approach makes it practical to fabricate very thin cantilevers and thus enable bi-stable latching operation of the switch.

The device does not require wafer bonding. Fabrication costs are reduced because additional wafers and wafer bonding equipment are not needed. The wafer area normally required for bonding is eliminated, further reducing the final device cost. Alignment errors associated with wafer bonding are thus eliminated. The difficulty of aligning and bonding wafers inclusive of fragile released MEMS structures is eliminated.

The present device cantilever does not need to be fabricated with a built-in curl to form the device.

The thin film encapsulation allows better control of the critical vertical dimensions of the device.

The actuator and RF signal path areas in the described device are combined on the same part of the moving beam resulting in a more compact arrangement and reducing radio frequency losses.

Capacitive coupling of the radio frequency signal path as used in this device allows for hot switching much higher radio frequency power compared to ohmic contacts which are limited by the contact material properties.

The natural series-shunt configuration in the described switch improves the high-frequency isolation in comparison with the series-only topology.

Several alternative arrangements of the invention are also contemplated.

Additional contact metal layers may be added on the cantilever-beam side of the actuator dielectrics allowing the switch to operate with ohmic contacts. An ohmic contact arrangement can also be effected by depositing the first dielectric layer between the resistor layer and the radio frequency metal layer, patterning pull-down holes through the radio frequency metal layer, and providing an additional independent bias contact to the resistor layer. The series-contact shunt-capacitive arrangement should promises exceptionally broad bandwidth.

The thin-film encapsulation may be sealed with a thick dielectric layer allowing planar transitions through the shell. In this case, an additional metal layer must be deposited on top of the shell to form the pull-up electrode.

The device may be arranged as a normal single-pole double-throw switch in which the upper and lower fixed electrodes provide separate output paths.

The device may be arranged such that the cantilever beam forms an S-shaped actuator, with part of the beam remaining in contact with the upper actuator at all times.

The device may be arranged with a more rigid, curled cantilever beam so that it returns to the initial stable state when the bias voltage is removed.

An integrated process for forming a latching capacitive radio frequency MEMS switch with an S-shaped actuator in a thin-film single wafer package has therefore been disclosed herein. Many alternate radio frequency configurations are possible using this type of switch and can provide improved broad-band performance once a more complete model for the S-shaped actuator switch is developed.

While the apparatus and method herein described constitute a preferred embodiment of the invention, it is to be understood that the invention is not limited to this precise form of apparatus or method and that changes may be made therein without departing from the scope of the invention, which is defined in the appended claims.

We claim:

1. A method of making a zip-mode actuated, mono wafer self-latching MEMS electrical switch comprising the steps of:

placing a fixed position metal electrical contact and coplanar surrounding metal on an electrically insulating substrate member;

forming a first layer of electrical charge retention-capable dielectric material over said fixed position metal electrical contact;

overlaying said layer of electrical charge retention-capable dielectric material, and said fixed position metal electrical contact with a first layer of sacrificial material;

providing a low spring constant, elongated, flexible, thin, cantilever, metallic switch wiper member over said first layer of sacrificial material and a selected portion of said electrically insulating substrate member, a free end of said wiper member residing contiguous said fixed position metal electrical contact;

covering said metallic switch wiper member, said first layer of sacrificial material, said first layer of electrical charge retention-capable dielectric material, said selected portion of said electrically insulating substrate member with a second shaped mass of said sacrificial organic material;

adding a second layer of said electrical charge retention-capable dielectric material over said second shaped mass of sacrificial organic material;

supplying a sealable metallic cap member over all of said second layer of electrical charge retention-capable dielectric material, said second shaped mass of said sacrificial organic material, said metallic switch wipe member, said first layer of sacrificial organic material, said first layer of electrical charge retention-capable dielectric material and said selected portion of said electrically insulating substrate member; and releasing said metallic switch wiper member from captivity in said sacrificial organic material in a releasing sequence accomplished within switch wiper member protecting confines for said sealable metallic cap member;

whereby said released switch wiper member is susceptible to receiving an opposing curvature s-shaped stable profile contour in at least one of a said electrical contact adjacent and a said sealable cap layer adjacent transiently energized switch wiper member operating positions.

2. The method of making a zip-mode actuated, mono wafer self-latching MEMS electrical switch of claim 1 wherein said electrical switch is a capacitance coupled radio frequency signal path selecting single pole switch.

3. The method of making a zip-mode actuated, mono wafer self-latching MEMS electrical switch of claim 2 wherein said electrical switch is a single pole double throw switch.

4. The method of making a zip-mode actuated, mono wafer self-latching MEMS electrical switch of claim 1 wherein each of said placing, forming and overlaying steps includes photographic masking, exposing and selective reacting steps including photoresist materials.

5. The method of making a zip-mode actuated, mono wafer self-latching MEMS electrical switch of claim 4 wherein said sacrificial materials are also photoresist materials.

6. The method of making a zip-mode actuated, mono wafer Self-latching MEMS electrical switch of claim 1 wherein said overlaying and covering steps each include a depositing, patterning and reflowing sequence in processing said sacrificial materials.

7. The method of making a zip-mode actuated, mono wafer self-latching MEMS electrical switch of claim 1 wherein said sacrificial materials comprise Polymethylglutarimide photoresist material.

8. The method of making a zip-mode actuated, mono wafer self-latching MEMS electrical switch of claim 7 wherein said step of releasing said metallic switch wiper member from captivity includes dissolving said Polymethylglutarimide photoresist material using a N-Methyl-2-Pyrrolidine based organic solvent.

9. The method of making a zip-mode actuated, mono wafer self-latching MEMS electrical switch of claim 1 wherein said providing step includes a metal evaporating and lifting off sequence of steps achieving said switch wiper member.

10. The method of making a zip-mode actuated, mono wafer self-latching MEMS electrical switch of claim 1 wherein said step of releasing said metallic switch wiper member from captivity in said sacrificial organic material within switch wiper member protecting confines of said sealable metallic cap member includes a liquid solvent processing step performed through apertures residing in said sealable cap member.

11. The method of making a zip-mode actuated, mono wafer self-latching MEMS electrical switch of claim 1 wherein said step of supplying a sealable metallic cap member over all of said second layer of electrical charge retention-capable dielectric material includes both a metal depositing and a metal plating step.

12. An integrated circuit process compatible method of making a zip-mode actuated, mono wafer MEMS electrical switch, said method comprising the steps of:
    assembling multiple sub layers of said switch on an insulating substrate member, said sub layers including an exposed first sacrificial layer;
    fabricating a fragile, thin film, low spring constant, movable switch wiper arm member of said switch on said first sacrificial layer;
    covering said movable switch wiper arm and said multiple sub layers with a second sacrificial layer to form a stack assembly;
    overlaying said stack assembly with an enclosing perforated shield member;
    removing said sacrificial layers from said stack assembly via perforations in said perforated shield member and a liquid removal sequence;
    said removing step releasing said fragile, thin film, low spring constant, movable switch wiper arm member from sacrificial layer captivity within protective confines of said enclosing perforated shield member; and
    sealing said shield member perforations with an externally applied material;
    whereby said released, fragile, thin film, low spring constant, movable switch wiper arm member is susceptible to S shaped profile, zip mode, actuation by control electrodes attending said multiple sub layers and said enclosing perforated shield member.

13. The integrated circuit process compatible method of making a zip-mode actuated, mono wafer MEMS electrical switch of claim 12 wherein said step of assembling multiple sub layers of said switch on an insulating substrate member includes forming a plurality of metal conductor layers on said substrate.

14. The integrated circuit process compatible method of making a zip-mode actuated, mono wafer MEMS electrical switch of claim 12 wherein said step of sealing said shield member perforations with an externally applied material includes covering said shield member with a layer of metal.

15. The integrated circuit process compatible method of making a zip-mode actuated, mono wafer MEMS electrical switch of claim 12 wherein said step of fabricating a fragile, thin film, low spring constant, movable switch wiper arm member of said switch on said first sacrificial layer includes evaporating, patterning and liftoff processing of a gold film layer.

16. The integrated circuit process compatible method of making a zip-mode actuated, mono wafer MEMS electrical switch of claim 15 wherein said gold film layer is of 500 nanometers thickness and at least 250 micrometers length.

17. A single wafer wet processing method of forming a radio frequency MEMS electrical switch, said method comprising the steps of:
    fabricating a fixed position metallic contact of said MEMS switch on an insulating wafer substrate;
    forming a plurality of switch related layers including an uppermost sacrificial material layer in attendance of said fixed position metallic Contact on said wafer substrate;
    producing a fragile thin film metallic cantilever switch movable arm member in fixed position on said uppermost sacrificial material layer of said plurality of switch related layers;
    enclosing said fragile thin film metallic cantilever switch movable arm member in an additional layer of said sacrificial material;
    disposing an enclosing additional fixed contact member onto said additional layer of said sacrificial material; and
    freeing said fragile thin film metallic cantilever switch movable arm member from fixed position, and now within said enclosing additional fixed contact member, captivity, and from within said sacrificial layers, with a wet processing, fragile thin film metallic cantilever switch movable arm member preserving, sequence.

18. The single wafer wet processing method of forming a radio frequency MEMS electrical switch of claim 17, wherein said step of forming a plurality of switch related layers includes forming on said substrate a metallic layer inclusive of Titanium and Gold.

* * * * *